United States Patent
Mei et al.

(10) Patent No.: US 11,031,869 B2
(45) Date of Patent: Jun. 8, 2021

(54) DUAL MODE SWITCHING REGULATOR WITH PWM/PFM FREQUENCY CONTROL

(71) Applicant: Texas Instruments Incorporated, Dallas, TX (US)

(72) Inventors: Tawen Mei, Sunnyvale, CA (US); David Zakharian, San Francisco, CA (US); Karen Chan, South San Francisco, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/745,028

(22) Filed: Jan. 16, 2020

(65) Prior Publication Data
US 2020/0274445 A1    Aug. 27, 2020

Related U.S. Application Data (63) Continuation of application No. 16/283,862, filed on Feb. 25, 2019, now abandoned.

(51) Int. Cl.

| | |
|---|---|
| *H02M 3/156* | (2006.01) |
| *G05F 1/56* | (2006.01) |
| *G05F 1/565* | (2006.01) |
| *H02M 3/158* | (2006.01) |
| *H03K 5/24* | (2006.01) |
| *H02M 3/157* | (2006.01) |
| *G05F 1/575* | (2006.01) |
| *H02M 1/00* | (2006.01) |

(52) U.S. Cl.
CPC .............. *H02M 3/158* (2013.01); *H03K 5/24* (2013.01); *G05F 1/56* (2013.01); *G05F 1/565* (2013.01); *G05F 1/575* (2013.01); *H02M 3/156* (2013.01); *H02M 3/157* (2013.01); *H02M 3/1563* (2013.01); *H02M 2001/0006* (2013.01)

(58) Field of Classification Search
CPC ........... G05F 1/56; G05F 1/565; H02M 3/156
USPC ......................................... 323/274, 282, 284
See application file for complete search history.

(56) References Cited

U.S. PATENT DOCUMENTS

| | | | | |
|---|---|---|---|---|
| 5,568,044 | A * | 10/1996 | Bittner .................. | H02M 3/156 |
| | | | | 323/272 |
| 2006/0043953 | A1* | 3/2006 | Xu ........................ | H02M 3/156 |
| | | | | 323/282 |
| 2015/0035511 | A1* | 2/2015 | Mei ....................... | H02M 3/156 |
| | | | | 323/284 |

* cited by examiner

*Primary Examiner* — Gary A Nash
(74) *Attorney, Agent, or Firm* — Michael A. Davis, Jr.; Charles A. Brill; Frank D. Cimino (57) ABSTRACT

A dual mode switching regulator includes a PWM/PFM control architecture with PFM frequency foldback based on extending switching cycle off time TOFF. A controller includes a PWM/PFM clock generator that, in response to assertion of a TOFF control signal, extends the nominal PWM switching cycle off-time TOFFnom for an extended off-time TOFFext (variable), so that switching cycle off-time is [TOFFnom+TOFFext]. A TOFF modulator generates the TOFF control signal based on generating a TOFF control voltage from an ITOFF control current equal to [IPWM-IPFM], generated by sourcing an IPWM reference current, and, in response to a PFM load condition, sinking an IPFM control current. The TOFF control signal is asserted when the TOFF control voltage is not substantially equal to a TOFF reference voltage at the end of TOFFnom, to cause the PWM/PFM clock generator to extend switching cycle off-time to [TOFFnom+TOFFext], with the duration of TOFFext determining PFM switching frequency.

19 Claims, 4 Drawing Sheets

DUAL MODE SWITCHING REGULATOR WITH PWM/PFM FREQUENCY CONTROL

CROSS REFERENCE TO RELATED APPLICATIONS

Under 35 U.S.C. § 120, this continuation application claims benefits of and priority to U.S. patent application Ser. No. 16/283,862 (TI-76314), filed on Feb. 25, 2019, the entirety of which are hereby incorporated herein by reference.

BACKGROUND

A switching regulator includes a power stage with one or more power/switching transistors, and a controller. The switching regulator is coupled to a load through an output filter network which can be represented as a power inductor and an output capacitor. The switching regulator, power stage and controller, and output filter network form a switched mode power supply (SMPS) for supplying load current at a regulated output voltage.

The switching regulator can be designed for synchronous or nonsynchronous control of a power stage with high and low side power transistors (synchronous control), or a high-side power transistor with a low-side diode (nonsynchronous control). In both configurations, the high and low side transistor/diode are connected at a switch node coupled through the output filter network to the load.

The controller embodies a feedback/control loop that monitors actual VOUT with reference to regulated (programmed) VOUT, and controls power stage switching at a regulated duty cycle [TON/(TON+TOFF)], to supply load current at the regulated VOUT. The controller (feedback/control loop) can provide voltage regulation directly, by voltage mode control of VOUT, or indirectly, by current mode control of load (inductor) current.

Dual mode PWM/PFM switching regulators include PWM mode, in which switching is at a specified nominal frequency and duty cycle is modulated, and PFM mode, in which switching frequency is modulated, for example based on constant on or off time, or pulse skipping. Dual mode control can be used to improve SMPS efficiency, using PWM for higher load currents (normal operation), and transitioning to PFM (lower frequency) mode at low/no load current conditions.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

This Disclosure describes apparatus and methods for a dual mode switching regulator, including a PWM/PFM control architecture with PFM frequency foldback based on extending switching cycle off-time.

According to aspects of the Disclosure, a switching regulator includes a controller to provide switching control signals, in successive switching cycles, for controlling a power stage, with a switching cycle period [TON+TOFF], and duty cycle [TON/(TON+TOFF)], the controller operable in a PWM (pulse width modulation) switching mode, with a nominal PWM switching frequency fnom, and a PFM (pulse frequency modulation) switching mode, with a variable PFM switching frequency fpfm less than fnom, with a transition between the PWM and PFM switching modes based on a defined PFM load condition. The controller can include clock circuitry to generate a switching-cycle clock signal, including, for each switching cycle, to control a TOFF period of the duty cycle, based on a TOFF control signal, including: when the TOFF control signal is not asserted, to generate the switching-cycle clock signal for the PWM switching mode, with a nominal switching cycle off-time TOFFnom; and when the TOFF control signal is asserted, to generate an extended switching cycle off-time [TOFFnom+TOFFext] for the PFM switching mode, with the nominal switching cycle off-time TOFFnom extended by a variable extended off-time TOFFext. A TOFF modulator to generate the TOFF control signal can include PWM current source circuitry to source a PWM reference current IPWM to a node Ntoff, IPWM corresponding to operation in the PWM switching mode, and PFM current sink circuitry to controllably sink a PFM control current IPFM from the node Ntoff, in response to the PFM load condition. The PWM reference current IPWM and the PFM control current IPFM can be combined at the node Ntoff to provide an ITOFF control current [ITOFF=IPWM−IPFM]. The TOFF modulator can include TOFF control circuitry to generate a TOFF control voltage based on the ITOFF control current [ITOFF=IPWM−IPFM], and TOFF control signal generation circuitry to assert the TOFF control signal when the TOFF control voltage is not substantially equal to a TOFF reference voltage at the end of TOFFnom, so that a duration of TOFFext corresponds to a time until the TOFF control voltage based on the ITOFF control current is substantially equal to the TOFF reference voltage, to provide a corresponding variable PFM switching cycle period [TON+(TOFFnom+TOFFext)].

Other aspects and features of the invention claimed in this Patent Document will be apparent to those skilled in the art from the following Disclosure.

DETAILED DESCRIPTION

This Description and the Drawings constitute a Disclosure for a dual mode switching regulator including a PWM/PFM control architecture with PFM frequency foldback based on extending switching cycle off-time, including describing design examples (example implementations), and illustrating various technical features and advantages.

This Disclosure uses the following nomenclature. A dual mode switching regulator includes a switched power stage driven by a dual mode controller providing power conversion in two switching modes: PWM (pulse width modulation) in which the power stage is switched with a nominal PWM switching frequency fnom; and PFM (pulse frequency modulation) switching mode in which the power stage is switched with a variable PFM switching frequency fpfm which is less than fnom; where transition between the PWM and PFM switching modes is based on a defined PFM (low) load current condition. The switching regulator converts input power (VIN) into load current at a specified regulated voltage VOUT, with the controller driving the power stage with switching control signals in successive switching cycles, with a period [TON+TOFF], and a duty cycle [TON/(TON+TOFF)].

According to aspects of the Disclosure, the dual mode controller includes a TOFF modulator to control PFM frequency foldback, such as for low load current conditions, based on controlling the duty cycle clock to extend the TOFF period, instead of, for example, adjusting clock bias to control clock frequency for PFM operation. That is, for PWM switching mode, with nominal switching frequency fnom, the nominal PWM period is [TONnom+TOFFnom], and the nominal PWM duty cycle is [TONnom/(TONnom+TOFFnom)]. And, for PFM switching mode with the variable PFM switching frequency fpfm, the variable PFM period is [TON+(TOFFnom+TOFFext)], where TOFFext is a controlled, variable extension of the TOFF period (beyond TOFFnom).

A switching regulator according to the Disclosure can be implemented as a converter (switcher) in which the controller is integrated with the power stage transistor(s), or as a controller for use with an external power stage. A dual mode control architecture according to the Disclosure can be used with any regulator topology (such as buck, boost, buck-boost), and with any suitable power stage (synchronous, asynchronous, isolated), and with either voltage or current mode control.

In brief overview, a dual mode switching regulator includes a PWM/PFM control architecture with PFM frequency foldback based on extending switching cycle off time TOFF. A controller includes a PWM/PFM clock generator that, in response to assertion of a TOFF control signal, extends the nominal PWM switching cycle off-time TOFFnom for an extended off-time TOFFext (variable), so that switching cycle off-time is [TOFFnom+TOFFext]. A TOFF modulator generates the TOFF control signal based on generating a TOFF control voltage from an ITOFF control current equal to [IPWM-IPFM], generated by sourcing an IPWM reference current, and, in response to a PFM load condition, sinking an IPFM control current. The TOFF control signal is asserted when the TOFF control voltage is not substantially equal to a TOFF reference voltage at the end of TOFFnom, to cause the PWM/PFM clock generator to extend switching cycle off-time to [TOFFnom+TOFFext], with the duration of TOFFext determining PFM switching frequency.

Figure 1:
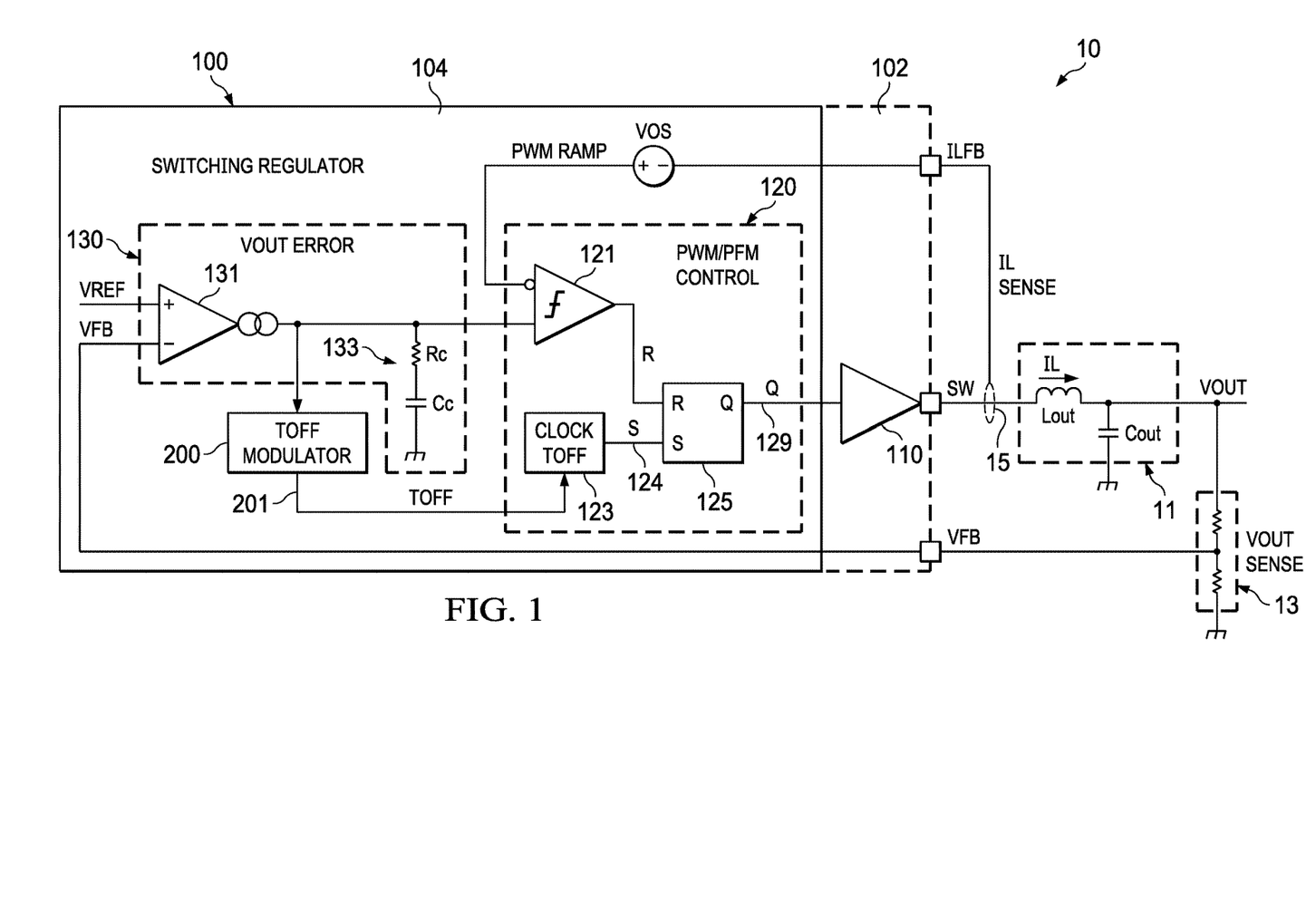
FIG. 1 illustrates an example switched mode power supply 10 with a dual mode switching regulator 100 (buck topology) that includes a power stage 102, and a dual mode PWM/PFM controller 104 with PWM/PFM switching control 120 [TON+TOFF] including PWM/PFM clock generator 123, and including a TOFF modulator 200 to provide TOFF control 201 to the clock generator to control PFM switching operation, including transition to PFM, based on extending TOFF, according to the Disclosure.

FIG. 1 illustrates an example switched mode power supply (SNIPS) 10 with a dual mode switching regulator 100 (example buck topology). SMPS 10 supplies load current at a regulated output voltage VOUT, through an output filter 11 represented by a power inductor Lout, and an output capacitor Cout. SMPS 10 includes a VOUT Sense circuit represented by resistor divider 13, and an IL Sense circuit represented by current sense node 15.

Switching regulator 100 supplies load current at the regulated VOUT through a switch node terminal/node SW. Switching regulator 100 includes a VFB input terminal/node to receive a feedback VOUT Sense voltage VFB from the VOUT sense circuit 13. The example switching regulator 100 is architected for current mode control, and includes an ILFB input terminal/node to receive a feedback IL Sense voltage ILFB generated by the IL Sense circuit.

Switching regulator 100 includes a switched power stage 102, and a dual mode controller 104 to provide switching cycle control for PWM and PFM switching modes. The switching regulator can be implemented as a converter (switcher) 100 in which the power stage 102 and dual mode controller 104 are integrated, or as a dual mode controller integrated circuit that drives an external power stage with PWM/PFM switching signals. If switching regulator 100 is implemented as a controller IC, the input terminals VFB and ILFB would be input terminals of the controller IC, and the switch node terminal SW would be an output driver terminal of the controller IC through with switching control signals 129 are driven to the power stage 102.

Power stage 102 is abstracted as a power amplifier 110, which can be any suitable power stage configuration, including synchronous, nonsynchronous, and isolated (such as forward and flyback). Power stage 102 (power amplifier 110) is coupled through the switch node/terminal SW to the load through the Lout/Cout output filter 11. Power stage 102 is driven by switching control signals from controller 104, with a controlled PWM/PFM duty cycle [TON/(TON+TOFF)]. The switching control signals control switching of the power stage transistor(s) (power amplifier 110), to supply through the SW terminal/node, load current at the regulated VOUT.

The example control architecture for switching regulator 100 uses peak current mode control for PWM/PFM power stage switching to supply load current with VOUT regulation, including VOUT regulation for PFM load current conditions. The example controller 104 includes an inductor current control loop, with feedback Sensed IL, to indirectly regulate VOUT by controlling inductor current.

Controller 104 provides switching control signals to the power stage 102 (power transistor(s) 110) with a controlled PWM/PFM duty cycle [TON/(TON+TOFF)]. In PWM switching mode, the power stage is switched with the nominal PWM switching frequency fnom, so that the nominal PWM period is [TONnom+TOFFnom], and the nominal PWM duty cycle is [TONnom/(TONnom+TOFFnom)]. In PFM switching mode, the power stage is switched with the variable PFM switching frequency fpfm, which according to aspects of Disclosure, is controlled by extending the nominal TOFFnom period by a variable extended TOFFext period, to provide a variable extended PFM period [TONnom+(TOFFnom+TOFFext)], and a variable PFM duty cycle [TONnom/(TONnom+(TOFFnom+TOFFext))].

Controller 104 includes PWM/PFM (TON) control 120 to generate switching control signals in successive switching cycles, to control a TON period of the duty cycle. The example PWM/PFM control 120 includes a PWM comparator 121 to control the TON period, and a PWM/PFM clock generator 123 to control switching frequency, either the nominal PWM frequency fnom, or for PFM operation during PFM low load current conditions, the variable PWM frequency fpfm.

According to aspects of the invention, Clock generator 123 is configured to transition to the PFM switching mode with a variable PFM frequency fpfm based on extending the TOFF period beyond the nominal TOFFnom, so that the extended PFM period is [TONnom+(TOFFnom+TOFFext)], and the corresponding PFM duty cycle is [TONnom/(TONnom+(TOFFnom+TOFFext))]. Clock generator 123 includes a TOFF control input to receive a TOFF control signal 201 to control transition to PFM for a defined (low) load current condition, and to control PFM switching operation including PFM frequency foldback.

Controller 104 includes a TOFF modulator 200 to generate the TOFF control signal 201 to the clock generator 123. TOFF modulator asserts/activates the TOFF control signal to transition from PWM to PFM switching modes, and deasserts/deactivates the TOFF control signal to control the duration of the (variable) extended TOFFext period, thereby controlling the variable PFM switching frequency fpfm.

Under current mode control, PWM comparator 121 receives inputs from two control loops: an outer voltage control loop that provides a VOUT error control voltage, and an inner current control loop that regulates VOUT indirectly by controlling inductor current IL. The VOUT error control voltage is generated by a VOUT error generator 130 based on a feedback voltage VFB, based on Sensed VOUT through a VOUT terminal/node. The inductor current control loop generates a PWM reference ramp voltage based on a feedback voltage ILFB corresponding to sensed inductor current IL through an ILFB terminal/node (Sensed IL), with Vos representing additional signal conditioning functionality, for example to adjust the input ILFB voltage to the input specification for the PWM comparator.

Alternately, for voltage mode control, VOUT can be regulated directly through a VOUT regulation loop, with the VOUT error generator 130 providing the VOUT error input to PWM comparator 121, and a ramp generator provide the reference ramp input.

The example VOUT error generator 130 is implemented with a transconductance error amplifier 131, and Rc/Cc compensation filter 133 to provide UV conversion. Error amplifier 131 receives a feedback voltage VFB corresponding to the output voltage VOUT (sense voltage divider VR), and a reference voltage VREF corresponding to the specified regulated VOUT, and generates the VOUT error voltage with I/V conversion by the compensation filter 133.

Clock generator 123 generates a switching-cycle clock signal 124 that controls PWM/PFM switching frequency, fnom or fpfm. For each switching cycle, clock generator 123 outputs an active clock transition (switching-cycle clock signal 124) to initiate the TON period, with TON duration controlled by the PWM comparator 121. The TOFF period of the switching cycle is controlled by the clock generator outputting a next active clock transition (clock signal 124) to initiate a next TON period (next switching cycle), effectively terminating the TOFF period for the current switching cycle.

Clock cycle active clock edge transitions, which effectively terminate the TOFF period, are generated by the clock generator 123 in response to the TOFF control signal 201 from TOFF modulator 200: for PWM mode, the switching cycle terminates after the nominal PWM period TOFFnom, and for PFM mode, according to aspects of the Disclosure, the switching cycle terminates after the extended PFM period [TOFFnom+TOFFext], including the controlled PFM extended TOFF time TOFFext.

PWM comparator 121 and clock generator 123 provide set and reset inputs to SR output logic 125, which outputs (Q) the switching control signals 129. Controller 104 is configured for peak current mode control, with clock generator 123 providing the set input, and PWM comparator 121 providing reset. Alternately, for example, controller 104 can be configured for valley current mode control, with the PWM comparator 121 providing the set input, and the clock generator providing reset.

For PWM switching mode, when the switching regulator 100 operates in a specified nominal operating range with higher load currents, clock generator 123 generates a switching-cycle clock signal 124 with the specified nominal PWM switching frequency fnom. The fnom clock edge initiates the TON period, controlled by the PWM comparator 121, with the nominal TOFFnom period terminated by the next fnom clock edge. The nominal PWM period is [(TON+TOFFnom)=1/fnom], and the nominal PWM duty cycle is [TON/(TON+TOFFnom)].

At a defined PFM load condition, for example at a defined low load current, switching regulator 100 transitions to the PFM switching mode. According to aspects of the Disclosure, PFM operation, including transitioning to the PFM switching mode, and setting the variable PFM switching frequency fpfm, is accomplished by controlling the TOFF period of the switching cycle. Specifically, clock generator 123 operates to extend the TOFF period beyond the nominal TOFFnom, so that the extended PWM TOFF period is [TOFFnom+TOFFext], effectively delaying clocking the next switching cycle TON period.

Clock generator 123 receives a TOFF control signal 201 from TOFF modulator 200. When the TOFF control signal 201 is asserted/active, clock generator 123 extends the TOFF period, delaying the clock edge transition that ends TOFF for the current switching cycle for the duration of the extended TOFFext time. When the TOFF control signal 201 is deasserted/inactive, after a variable delay TOFFext, clock generator 123 ends the TOFF period, and clocks TON for the next switching cycle. This process effectively extends the nominal TOFFnom period by the variable extended TOFFext period, providing a variable PFM period [TON+(TOFFnom+TOFFext)], for a variable PFM switching frequency fpfm.

Describing the TOFF control signal as asserted/active, and de-asserted/inactive indicates functional rather than physical signal states. Clock generator 123 is configured, for PFM switching mode, to respond to an active state of the TOFF control signal 201 (from TOFF modulator 200) to delay outputting an active clock edge transition to clock the next switching cycle, effectively extending the TOFF period of the current switching cycle by [TOFFnom+TOFFext].

TOFF modulator 200 asserts/activates the TOFF control signal to cause clock generator 123 to transition to PFM for a defined (low) load current condition, and extend the TOFF period beyond the nominal TOFFnom. TOFF modulator 200 deasserts/inactivates the TOFF control signal to cause the clock generator 123 to terminate the extended TOFFext, and transition the switching-cycle clock signal 124 with an active clock edge to initiate the next switching cycle (TON period), after the delay TOFFext. That is, the TOFF modulator 200 controls PFM switching operation and PFM frequency foldback by effectively controlling the duration of the variable extended PFM TOFFext.

Figure 2:
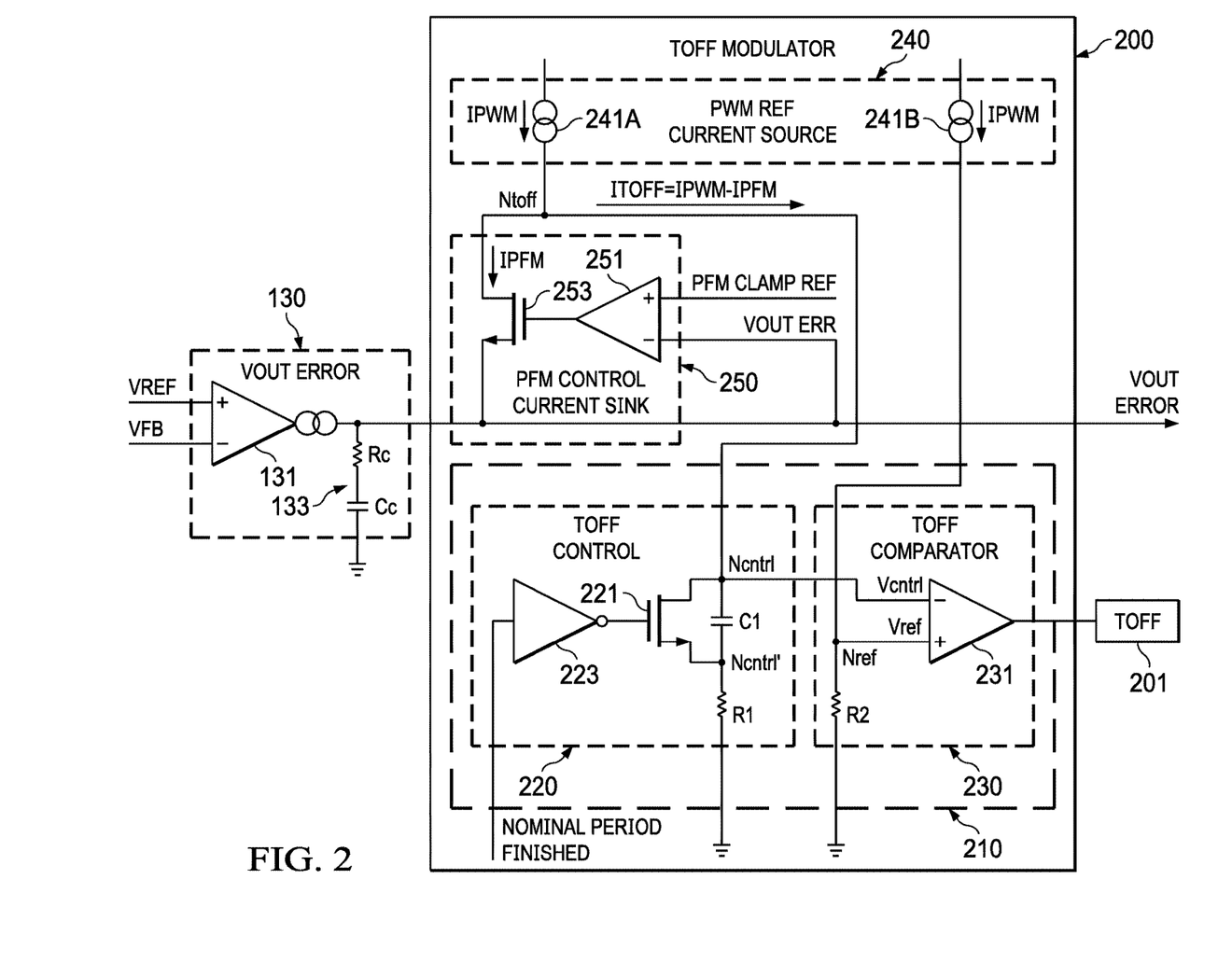
FIG. 2 illustrates an example TOFF modulator 200, providing TOFF control 201 to the PWM/PFM clock generator, including a ramp generator 220 and TOFF comparator 230 to generate TOFF control based on a TOFF control current [ITOFF=IPWM−IPFM], including a PWM reference (source) current IPWM from a PWM reference current source 240, and a PFM control (sink) current IPFM from a PFM control current sink 250, the IPFM sink current generated by clamping (251) the VOUT error signal for PFM (low) load conditions.

FIG. 2 illustrates an example TOFF modulator design 200, providing TOFF control to the PWM/PFM clock generator 123, to control transition to PFM for a defined (low) load current condition, and to control PFM switching operation including PFM frequency foldback based on extending the TOFF period beyond the nominal TOFFnom, according to the Disclosure. TOFF modulator 200 generates the TOFF control signal 201 input to the PWM/PFM clock generator (FIG. 1, 123).

TOFF modulator 200 includes a TOFF controller 210 to generate the TOFF control signal, based on a TOFF control current [ITOFF=IPWM−IPFM]. The example TOFF controller 210 includes TOFF control circuit 220, implemented as a ramp generator, to generate a TOFF control voltage Vcntrl at a node Ncntrl based on the TOFF control current [ITOFF=IPWM−IPFM], and a TOFF control signal generator 230 implemented with a TOFF comparator 231 to generate the TOFF control signal based on the TOFF control voltage Vcntrl at the Vcntrl node, relative to a TOFF reference voltage Vref at node Nref.

TOFF modulator 200 generates the TOFF control current [ITOFF=IPWM−IPFM] based on a PWM reference (source) current IPWM, and a PFM control (sink) current IPFM. TFF modulator 200 includes a PWM reference current source 240 to source the PWM reference current IPWM, and a PFM control current sink 250 to sink the PFM control current IPFM. PWM reference current source 240 is represented by two current sources 241A and 241B, each sourcing IPWM. The IPFM sink current is generated by clamping the VOUT error signal for PFM (low) load conditions.

TOFF modulator 200 generates, in each switching cycle, the ITOFF control current [ITOFF=IPWM−IPFM] through a TOFF node Ntoff. PWM current source 241A sources the PWM reference current IPWM into the node Ntoff. IPWM corresponds to operation in the PWM switching mode at the PWM switching frequency fnom.

PFM control current sink 250 detects and responds to a PFM (low) load current condition by sinking the PFM control current IPFM from the node Ntoff. IPFM is a variable current that corresponds in magnitude inversely to the required load current relative to a minimum load current supplied during PWM switching at the nominal PWM switching frequency fnom, so that as the required load current decreases, the PFM control (sink) current increases.

PFM control current sink 250 includes a PFM clamp amplifier 251, and a PFM control transistor 253. The PFM clamp amplifier 251 asserts a PFM load condition signal to indicate a PFM load current condition based on the VOUT ERROR signal, which is clamped to a PFM clamp reference voltage corresponding to the PFM load current condition. The PFM control transistor 253 is coupled to the node Ntoff, and in response to the assertion of the PFM load condition signal, sinks the PFM control current IPFM from the node Ntoff, IPFM corresponding inversely to a decrease in load current relative to the minimum PWM load current supplied at fnom.

TOFF controller 210 provides, in each switching cycle, the TOFF control signal (to the clock generator 123) based on the ITOFF control current [ITOFF=IPWM−IPFM]. TOFF controller 210 includes a TOFF control signal generator 230 implemented with a TOFF comparator 231. The TOFF comparator 231 generates the TOFF control signal based on the TOFF control voltage Vcntrl from node Ncntrl relative to the TOFF reference voltage Vref from node Nref, both derived from the IPWM reference (source) current.

The TOFF control voltage Vcntrl is generated by the ramp generator 220. Ramp generator 220 receives [ITOFF=IPWM−IPFM] to charge the ramp Ncntrl node to the ramp voltage Vcntrl. The example ramp generator 220 is implemented with a ramp capacitor C1, and ramp resistor R1. A bypass transistor 221 is controlled 223 to connect the Ncntrl node to either the ramp resistor R1 (for PWM switching mode), or the ramp capacitor C1 (for PFM switching mode during PFM load current conditions).

The TOFF reference voltage Vref is generated at the reference node Nref based on the IPWM reference current from PWM current source 241B, through a reference resistor R2. R2 is selected based on IPWM so that the Vref voltage input to the TOFF comparator 231 is within specification. For example, if IPWM is 1 uA, then the R2 is approximately 1 Mohm to set Vref at a 1V at the input of the TOFF comparator.

For PWM switching mode, with [ITOFF=IPWM−IPFM=IPWM−0] or [ITOFF=IPWM], the ramp capacitor is bypassed, connecting the Ncntrl node to an Ncntrl' node, and the TOFF control current [ITOFF=IPWM] flows through the ramp resistor R1 (nodes Ncntrl and Ncntrl'), which controls the TOFF control voltage V at the Ncntrl node (control input to the TOFF comparator 231). This same current IPWM from PWM current source 241B flows through the reference resistor R2 to provide the reference voltage Vref (reference input to the TOFF comparator 231).

The ramp resistor R1 and the reference resistor R2 are selected to be substantially equal, so that Vcntrl=[ITOFF=IPWM]*R1, and Vref=IPWM*R2, and Vcntrl=Vref. As a result, at the end of the PWM TOFFnom period, the TOFF control voltage Vcntrl and the TOFF reference voltage Vref inputs to the TOFF comparator 231 are equal, and the output TOFF control signal remains de-asserted. As a result, the clock generator ends the switching cycle after the nominal TOFFnom. That is, the TOFF period is not extended by the PFM TOFF period TOFFext, appended to the nominal PWM TOFFnom period.

R1 can be sized just above reference resistor R2, so that, at the end of the nominal PWM TOFFnom period, the TOFF control voltage Vcntrl input to the TOFF comparator is ensured to exceed the TOFF reference voltage Vref input to the TOFF comparator, ensuring that the output TOFF control signal remains de-asserted (for example, compensating for comparator input offsets).

For PFM switching mode, in response to a PFM load current condition (as detected by the PFM control current sink 250 and PFM clamp amplifier 251), the IPFM control (sink) current is nonzero, and the ITOFF control current is [PWM−IPFM]. As a result, the TOFF control voltage Vcntrl is less than the TOFF reference voltage Vref, and the TOFF control signal is asserted by the TOFF comparator 231. At the end of the nominal PWM TOFFnom period, with the TOFF control signal deasserted, the bypass through bypass transistor 221 is released, and the Ncntrl node is connected to the ramp capacitor C1, which charges during the extended PFM TOFF period TOFFext, so that the extended PFM period is [TOFFnom+TOFFext].

The TOFF control voltage Vcntrl is now controlled by Cramp charged by the ITOFF control current [ITOFF=IPWM−IPFM], until Vcntrl reaches the ITOFF reference voltage Vref, after the time TOFFext determined by the Cramp/Rramp time constant, causing the TOFF comparator 231 to de-assert (inactivate) the TOFF control signal. As a result, the clock generator terminates the extended TOFFext period, i.e., the extended PFM period [TOFFnom+TOFFext], and initiates the next switching cycle.

That is, for PWM operation with higher load currents, the PFM control current IPFM is zero, so that [ITOFF=IPWM−IPFM=IPWM−0] and [ITOFF=IPWM]. ITOFF charges node Ncntrl to the TOFF control voltage Vcntrl=Vref within time TOFFnom for the PWM switching mode. And, for PFM operation with lower load currents, the PFM load condition is detected, so that the PFM load condition signal is asserted to cause the PFM control transistor to sink IPFM from the node Ntoff. As a result, [ITOFF=IPWM−IPFM] (IPFM is non-zero), and the ramp generator is engaged to charge Ncntrl node to the TOFF control voltage Vcntrl=Vref based on the ramp capacitor C1, with Vcntrl reaching Vref within time [TOFFnom+TOFFext], delayed by the extended TOFF period TOFFext, where the extended TOFF period TOFFext corresponds to the magnitude of the IPFM sink current, which controls the delay in Vcntrl charging to Vref relative to the time TOFFnom to charge Vcntrl during PWM switching mode.

The TOFF comparator 231 receives the TOFF control voltage Vcntrl input from Ncntrl node, and the TOFF reference voltage Vref input from Nref node, and provides, in each switching cycle, the TOFF control signal based on the ramp voltage Vcntrl at the Vcntrl node, relative to the reference voltage Vref at the Vref node.

When the PFM load current condition is not detected/indicated, the PWM sink current IPWM is zero, and [ITOFF=IPWM−IPFM=IPWM−0], and Vcntrl= [ITOFF=IPWM]*R1 charges the Ncntrl node to Vref=IPWM*R2 within the nominal TOFF time TOFFnom. As a result, the TOFF comparator output TOFF control remains de-asserted, so that the clock generator ends the PWM switching cycle with the nominal TOFFnom period, with the nominal PWM switching frequency fnom, and associated nominal PWM period [TON+TOFFnom].

When the PFM load condition is detected, as indicated by VOUT error reaching the PFM clamp reference, causing the PFM control current sink 250 to sink IPFM current, so that [ITOFF=IPWM−IPFM] with IPFM non-zero, causing the TOFF control voltage Vcntrl=[IPWM−IPFM]*R1 to charge the Ncntrl node more slowly than the TOFF reference voltage Vref=IPWM*R2 charges the Vref node, so that, the TOFF comparator asserts the TOFF control signal. As a result, at the end of the nominal TOFFnom period Vcntrl is less than Vref, the TOFF control signal remains asserted, and the ramp capacitor is connected to the Ncntrl node to finish charging Vcntrl to VREF with a delay corresponding to the extended TOFF period TOFFext. With Vcntrl=Vref, the TOFF comparator de-asserts the TOFF control signal to the clock generator 123, so that the TOFF period is extended to [TOFFnom+TOFFext] corresponding to the PFM switching frequency fpfm for the variable PFM switching mode.

Figure 3A:
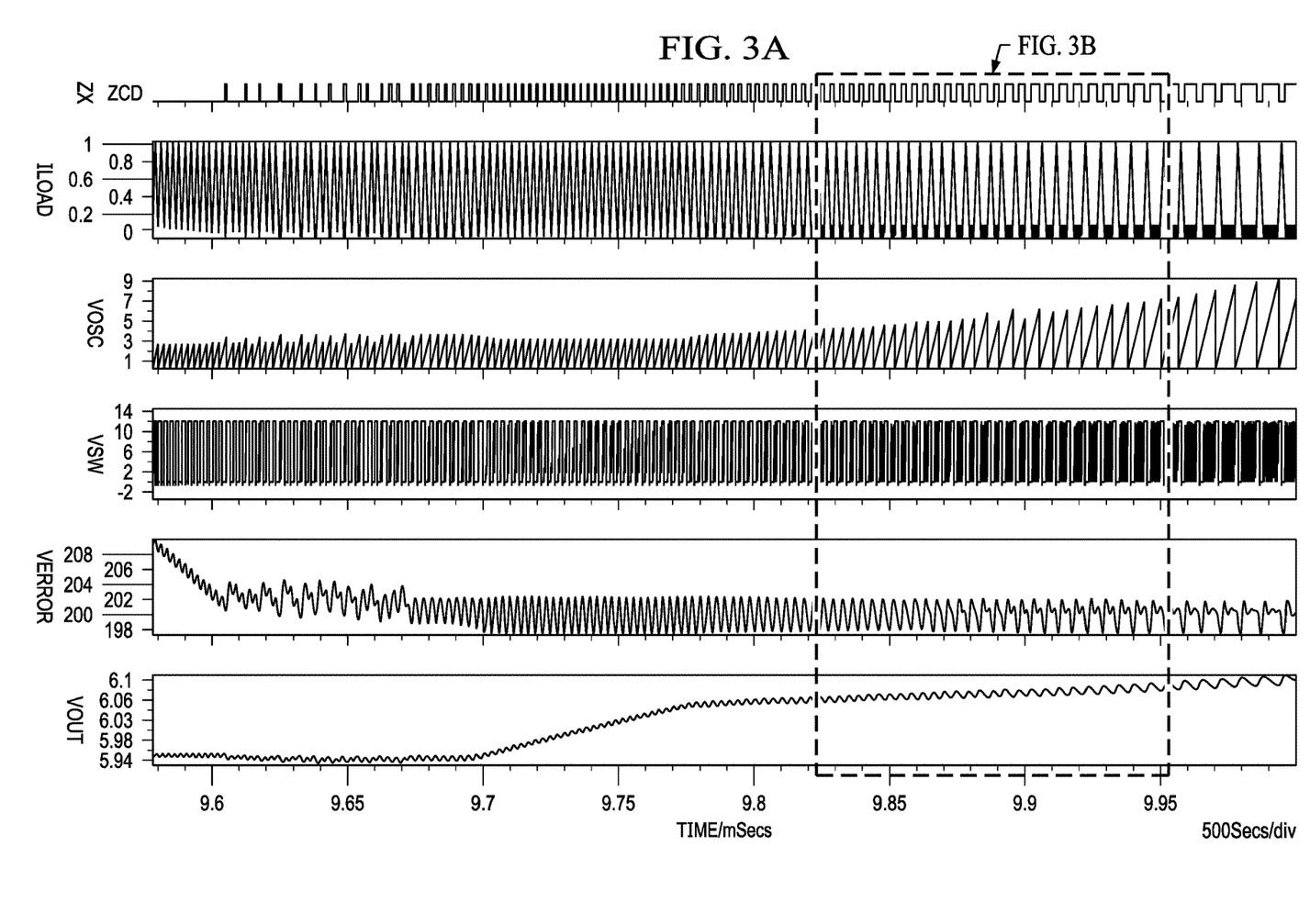
FIGS. 3A and 3B provide example waveforms illustrating a transition from PWM to PFM based on extending off-time TOFF as load current is reduced, so that PFM off-time TOFF (extended) is longer than the PWM TOFF(nominal).
Figure 3B:
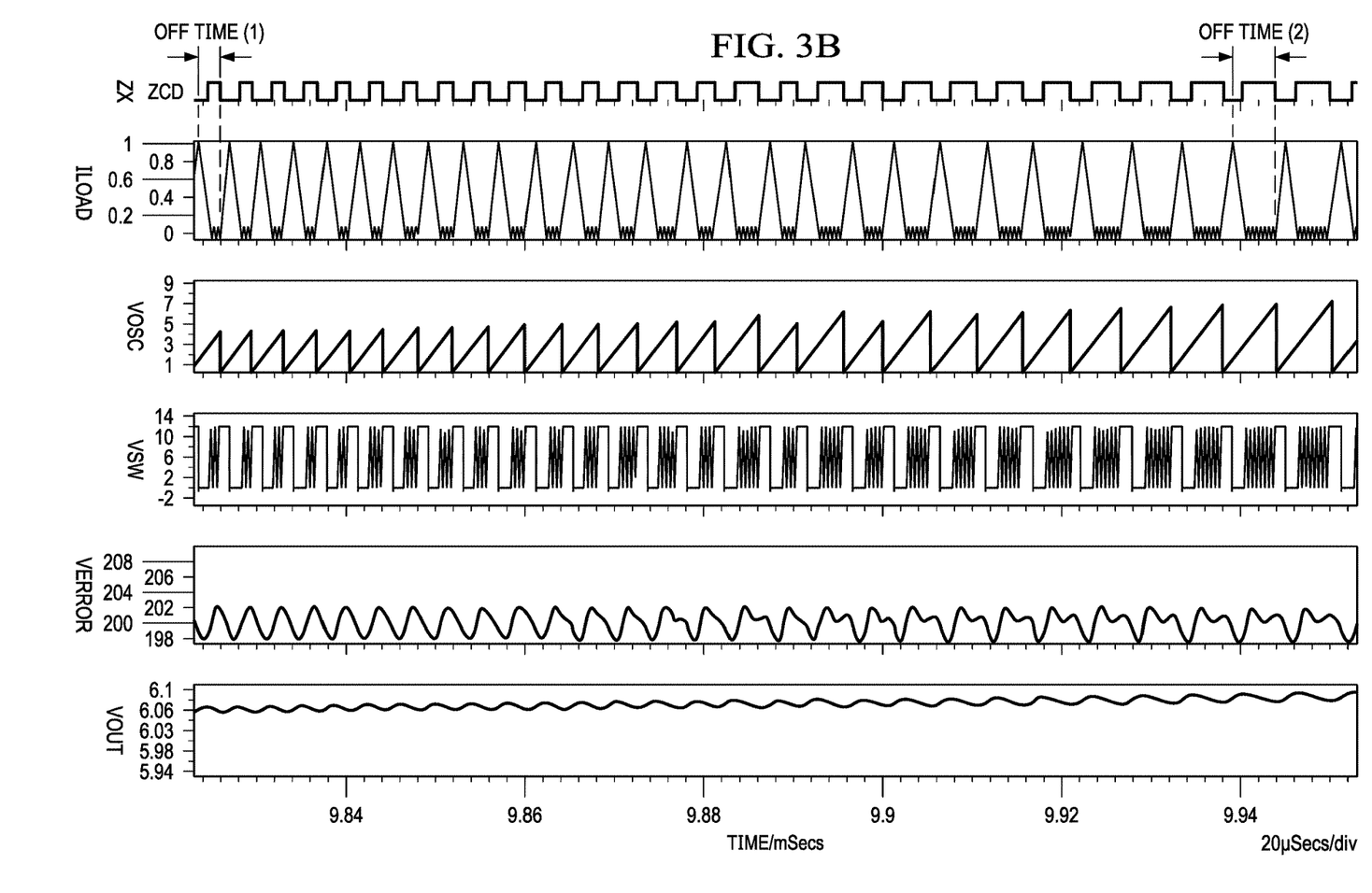

FIGS. 3A and 3B provide example waveforms illustrating a transition from PWM to PFM based on extending off-time TOFF as load current is reduced, so that the PFM extended off-time TOFFext is appended to the PWM TOFFnom, so that the extended PFM TOFF period is [TOFFnom+TOFFext].

In summary, referring to FIGS. 1 and 2, the example TOFF modulator 200 operates to control the PFM switching mode, including PFM frequency foldback, by introducing a variable extended PWM off-time TOFFext (as opposed to, modulating clock generator bias current). TOFFext is appended to the end of the nominal PWM period TOFFnom, with TOFFext increasing in proportion to the negative overdrive at the input of the error amplifier 131 (VFB−VREF). An advantage of controlling PFM frequency foldback based on an extended PWM off-time TOFFext is that the negative overdrive at the input of the error amplifier (VFB−VREF) has an upper limit, the PFM clamp reference input to the PFM clamp amplifier 251, determined by design, irrespective of the nominal switching cycle frequency fnom (which is configured for nominal PWM operation at load current conditions higher than a specified PFM load current condition).

In normal operation, the VOUT error output of the error amplifier 231 is above the PFM clamp reference voltage input to the PFM clamp amplifier 251, and the PFM sink current IPFM is zero, so that the full [ITOFF=IPWM] flows through the ramp resistor R1 (bypassing the ramp capacitor C1), which charges the Ncntrl node to Vcntrl= [ITOFF=IPWM]*R1, which is substantially equal to the the the Vref node charged to Vref=IPWM*R2, within the nominal PWM period [TON+TOFFnom], so that the TOFF comparator 231 output TOFF control remains de-asserted, and an extended PWM TOFF period TOFFext is not appended to the nominal PWM TOFFnom period.

As load current is reduced to a PFM load current condition, the VOUT error output from the error amplifer starts falling. Once VOUT error falls below the PFM clamp reference voltage, to indicate the PFM load current condition, the PFM clamp amplifier 251 asserts the PFM load condition signal to turn on the PFM control transistor 253, sinking PFM control current IPFM from the Ntoff node, and decreasing the ITOFF control current [ITOFF=IPWM−IPFM]. As a result, the TOFF control voltage Vcntrl= [TOFF−IPWM−IPFM]*R1 charges the Ncntrl node slower than the Vref node is charged by the TOFF reference voltage Vref=IPWM*R2, and the TOFF comparator 231 asserts the TOFF control signal. After the nominal TOFFnom period, the ramp capacitor C2 is connected to the Vcntrl node, and charged by [ITOFF−IPWM] to Vcntrl−Vref, and the TOFF comparator de-asserts the TOFF control signal after the extended PFM TOFFext period. The time required to charge the Ncntrl node to Vref is the extended TOFFext that will be appended to the nominal TOFFnom, increasing the PFM period [TOFFnom+TOFFext]. As a result, switching frequency is reduced from fnom to fpfm, reducing load current delivered to the load. If ITOFF is reduced to zero, the TOFF control signal will not de-assert, and no further switching will occur until there is additional energy demand.

The Disclosure provided by this Description and the Figures sets forth example designs and applications illustrating aspects and features of the invention, and does not limit the scope of the invention, which is defined by the claims. Known circuits, connections, functions and operations are not described in detail to avoid obscuring the principles and features of the Disclosed example designs and applications. This Disclosure can be used by ordinarily skilled artisans as a basis for modifications, substitutions and alternatives, including adaptations for other applications.

What is claimed is:

1. An apparatus comprising:
an error amplifier configured to generate an error signal based on a comparison between a feedback voltage received from an output of a power converter and a reference voltage;
a pulse modulation circuit configured to generate a switching control signal for the power converter based on the error signal and an off-time (TOFF) control signal; and
a TOFF modulation circuit coupled between the error amplifier and the pulse modulation circuit, the TOFF modulation circuit configured to generate the TOFF control signal including an extended TOFF based on a comparison between the error signal and a pulse frequency modulation (PFM) threshold signal, in which the TOFF modulation circuit includes: a comparator having a first input configured to receive a pulse width modulation (PWM) reference signal; and a second input configured to receive a PFM control signal representing a difference between the error signal and the PFM threshold signal.

2. The apparatus of claim 1, wherein the pulse modulation circuit is configured to extend a TOFF of a switching cycle in the switching control signal by the extended TOFF.

3. The apparatus of claim 1, wherein the pulse modulation circuit includes:
- a clock generator having an input configured to receive the TOFF control signal, and a clock output;
- a pulse width modulation (PWM) comparator having a first input configured to receive the error signal, a second input configured to receive a ramp signal, and a PWM output; and
- a set-reset (SR) latch having a reset input coupled to the PWM output, a set input coupled to the clock output, and a latch output configured to provide the switching control signal.

4. The apparatus of claim 1, wherein the TOFF modulation circuit includes:
- a pass transistor having a first current terminal, a second current terminal coupled to a current sink path, and a control terminal;
- a current source having a current output node coupled to the second input of the comparator and the first current terminal of the pass transistor; and
- a PFM amplifier having a first input configured to receive the PFM threshold signal, a second input configured to receive the error signal, and an amplifier output coupled to the control terminal.

5. The apparatus of claim 1, wherein the TOFF modulation circuit includes:
- a reference current source coupled to the first input of the comparator;
- a reference resistor coupled between the first input of the comparator and a ground terminal;
- a control current source configured to provide a control current to the second input of the comparator, the control current is adjustable based on the difference between the error signal and the PFM threshold signal; and
- a control current path coupled between the second input of the comparator and the ground terminal.

6. The apparatus of claim 5, wherein the control current path includes:
- a capacitor having a first plate coupled to the second input of the comparator, and a second plate; and
- a control resistor having a first end coupled to the second plate, and a second end coupled to the ground terminal.

7. The apparatus of claim 6, wherein the reference resistor has a first resistance, and the control resistor has a second resistance substantially equals to the first resistance.

8. The apparatus of claim 6, wherein the control current path includes a bypass transistor coupled across the first and second plates of the capacitor.

9. The apparatus of claim 8, wherein the bypass transistor is enabled after the extended TOFF expires.

10. An apparatus comprising:
- an error amplifier configured to generate an error signal based on a comparison between a feedback voltage received from an output of a power converter and a reference voltage;
- a pulse modulation circuit configured to generate a switching control signal for the power converter based on the error signal and an off-time (TOFF) control signal; and
- a TOFF modulation circuit coupled between the error amplifier and the pulse modulation circuit, the TOFF modulation circuit including a comparator having a first input configured to receive a pulse width modulation (PWM) reference signal, a second input configured to receive a PFM control signal representing a difference between the error signal and a pulse frequency modulation (PFM) threshold signal, and a comparator output configured to provide the TOFF control signal.

11. The apparatus of claim 10, wherein the TOFF modulation circuit is configured to generate the TOFF control signal including an extended TOFF based on a comparison between the error signal and the PFM threshold signal.

12. The apparatus of claim 11, wherein the pulse modulation circuit is configured to extend a TOFF of a switching cycle in the switching control signal by the extended TOFF.

13. The apparatus of claim 10, wherein the pulse modulation circuit includes:
- a clock generator having an input configured to receive the TOFF control signal, and a clock output;
- a pulse width modulation (PWM) comparator having a first input configured to receive the error signal, a second input configured to receive a ramp signal, and a PWM output; and
- a set-reset (SR) latch having a reset input coupled to the PWM output, a set input coupled to the clock output, and a latch output configured to provide the switching control signal.

14. The apparatus of claim 10, wherein the TOFF modulation circuit includes:
- a pass transistor having a first current terminal, a second current terminal coupled to a current sink path, and a control terminal;
- a current source having a current output node coupled to the second input of the comparator and the first current terminal of the pass transistor; and
- a PFM amplifier having a first input configured to receive the PFM threshold signal, a second input configured to receive the error signal, and an amplifier output coupled to the control terminal.

15. The apparatus of claim 10, wherein the TOFF modulation circuit includes:
- a reference current source coupled to the first input of the comparator;
- a reference resistor coupled between the first input of the comparator and a ground terminal;
- a control current source configured to provide a control current to the second input of the comparator, the control current is adjustable based on the difference between the error signal and the PFM threshold signal; and
- a control current path coupled between the second input of the comparator and the ground terminal.

16. The apparatus of claim 15, wherein the control current path includes:
- a capacitor having a first plate coupled to the second input of the comparator, and a second plate; and
- a control resistor having a first end coupled to the second plate, and a second end coupled to the ground terminal.

17. The apparatus of claim 16, wherein the reference resistor has a first resistance, and the control resistor has a second resistance substantially equals to the first resistance.

18. The apparatus of claim 16, wherein the control current path includes a bypass transistor coupled across the first and second plates of the capacitor.

19. The apparatus of claim 18, wherein the bypass transistor is enabled after the TOFF control signal deasserted.

\* \* \* \* \*